(12) United States Patent
Kim

(10) Patent No.: US 8,576,645 B2
(45) Date of Patent: Nov. 5, 2013

(54) SEMICONDUCTOR MEMORY DEVICE CAPABLE OF MINIMIZING CURRENT CONSUMPTION DURING HIGH SPEED OPERATION

(75) Inventor: Tae-Kyun Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 160 days.

(21) Appl. No.: 13/103,409

(22) Filed: May 9, 2011

(65) Prior Publication Data
US 2012/0218834 A1    Aug. 30, 2012

(30) Foreign Application Priority Data

Feb. 28, 2011    (KR) .................... 10-2011-0017693

(51) Int. Cl.
*G11C 7/00*    (2006.01)
(52) U.S. Cl.
USPC .................... 365/193; 365/191; 365/233.1
(58) Field of Classification Search
USPC ...................... 365/191, 193, 233.1
See application file for complete search history.

(56) References Cited

U.S. PATENT DOCUMENTS

| | | | |
|---|---|---|---|
| 6,115,322 A * | 9/2000 | Kanda et al. | 365/233.14 |
| 7,092,299 B2 * | 8/2006 | Kwak et al. | 365/198 |
| 8,233,332 B2 * | 7/2012 | Nguyen et al. | 365/189.07 |
| 2005/0268059 A1 * | 12/2005 | LaBerge | 711/167 |
| 2010/0039875 A1 * | 2/2010 | Stott et al. | 365/193 |
| 2012/0081144 A1 * | 4/2012 | Song | 326/30 |

FOREIGN PATENT DOCUMENTS

KR    1020110002302    1/2011
KR      101053542     8/2011

OTHER PUBLICATIONS

Notice of Allowance issued by the Korean Intellectual Property Office on Jan. 31, 2013.

\* cited by examiner

*Primary Examiner* — VanThu Nguyen
(74) *Attorney, Agent, or Firm* — IP & T Group LLP

(57) ABSTRACT

A semiconductor memory device includes a signal processing unit configured to generate a control signal corresponding to burst length information and an output controlling unit configured to control an output of a data strobe signal in response to the control signal.

26 Claims, 11 Drawing Sheets

SEMICONDUCTOR MEMORY DEVICE CAPABLE OF MINIMIZING CURRENT CONSUMPTION DURING HIGH SPEED OPERATION

CROSS-REFERENCE TO RELATED APPLICATIONS

The present application claims priority of Korean Patent Application No. 10-2011-0017693, filed on Feb. 28, 2011, which is incorporated herein by reference in its entirety.

BACKGROUND

1. Field

Exemplary embodiments of the present invention relate to semiconductor design technology, and more particularly, to a semiconductor memory device and a method for operating the same.

2. Description of the Related Art

A semiconductor memory device, including a dynamic random access memory (DRAM), receives write data from a chipset (a memory controller) and transfers read data to the chipset. Here, the semiconductor memory device and the chipset may operate in synchronization with a system clock. However, when data is transferred from the chipset to the semiconductor memory device, data and a system clock may have different loads and signal traces. In addition, due to positional differences in transferring a system clock to a plurality of memories, a skew occurs between the data and the system clock.

In order to reduce the skew between the data and the system clock, a data strobe signal (DQS) is transferred together with the data when the data is transferred from the chipset to the semiconductor memory device. The data strobe signal (DQS) is also called an "echo clock". Since the data strobe signal (DQS) has the same load and signal trace as the data, the skew between the system clock and the data can be minimized by strobing data using the data strobe signal (DQS) in the semiconductor memory device.

Meanwhile, according to an example, the data strobe signal (DQS) toggles, for example, only in a set period. At this time, in toggling data strobe signal (DQS), when a high impedance (Hi-Z) state is to be entered after the last clock edge, a ringing often occurs. This phenomenon is called a write postamble ringing. More specifically, the data strobe signal (DQS) may not return to the high impedance (Hi-Z) state after the completion of the toggling when glitch occurs in the data strobe signal (DQS) due to noise. When the data strobe signal (DQS) is transferred, such a ringing may be generated due to characteristics of a transmission line or characteristics of a buffer for interfacing the data strobe signal (DQS).

Therefore, techniques for preventing the write postamble ringing have been developed. As an example of such a technique, a method of filtering a data strobe signal (DQS) may be used. Here, a filtering signal corresponding to a burst length is generated, and a data strobe signal (DQS) output period is limited according to the filtering signal. Therefore, even though glitch occurs in the postamble period of the data strobe signal (DQS), the write postamble ringing phenomenon can be prevented using the above-described filtering method.

However, the conventional filtering method also has the following features.

The filtering signal for filtering the data strobe signal (DQS) is generated in a clock domain because the data strobe signal (DQS) toggles during an appropriate period corresponding to the burst length and has a high impedance (Hi-Z) state in the remaining period. Here, the completion point of time for the write operation may not be accurately determined by using the data strobe signal (DQS). Accordingly, since a write command is applied in synchronization with a clock, the filtering signal is generated by calculating the completion point of time for the write operation by using the clock. However, since the domains of the clock and the data strobe signal (DQS) are different, a skew may occur between the data strobe signal (DQS) and the filtering signal generated in the clock domain. Accordingly, the data strobe signal (DQS) is not appropriately filtered, and the postamble ringing phenomenon may not be prevented.

Meanwhile, in order to address the above-described features, different domain signals are synchronized. However, since a signal delay and a probability for malfunctions increase due to such synchronizing operations, a high speed operation of a semiconductor device may not be achieved and current consumption may increase.

SUMMARY

An embodiment of the present invention is directed to a semiconductor memory device which is capable of preventing a write postamble ringing phenomenon of a data strobe signal (DQS) and a method for operating the same.

Another embodiment of the present invention is directed to a semiconductor memory device which is capable of minimizing current consumption during a high speed operation without signal delay, where a write postamble ringing phenomenon of a data strobe signal (DQS) is prevented, and a method for operating the same.

In accordance with an embodiment of the present invention, a semiconductor memory device includes: a signal processing unit configured to generate a control signal corresponding to burst length information; and an output controlling unit configured to control an output of a data strobe signal in response to the control signal. The semiconductor memory device may further include a monitoring unit configured to monitor a time interval between column commands and the signal processing unit may determine the activation of the control signal in response to a monitoring signal outputted from the monitoring signal generating unit.

In accordance with another embodiment of the present invention, a semiconductor memory device includes: a first input unit configured to output an internal data strobe signal in response to an external data strobe signal; an enable signal generating unit configured to generate an enable signal according to the data strobe signal and termination resistance information; a filtering signal generating unit configured to generate a filtering signal in response to the internal data strobe signal, the enable signal, an internal ODT mode entry signal, an ODT mode related signal, and an internal clock; and an output controlling unit configured to receive the internal data strobe signal and stop an output period of the internal data strobe signal in response to the filtering signal.

In accordance with yet another embodiment of the present invention, a method for operating a semiconductor memory device includes: monitoring an interval between write commands; and continuously outputting a data strobe signal when a time interval between adjacent write commands is a first time interval, and stopping a toggling period of the outputted data strobe signal when the time interval between the adjacent write commands is greater than the first time interval.

DETAILED DESCRIPTION

Figure 1:
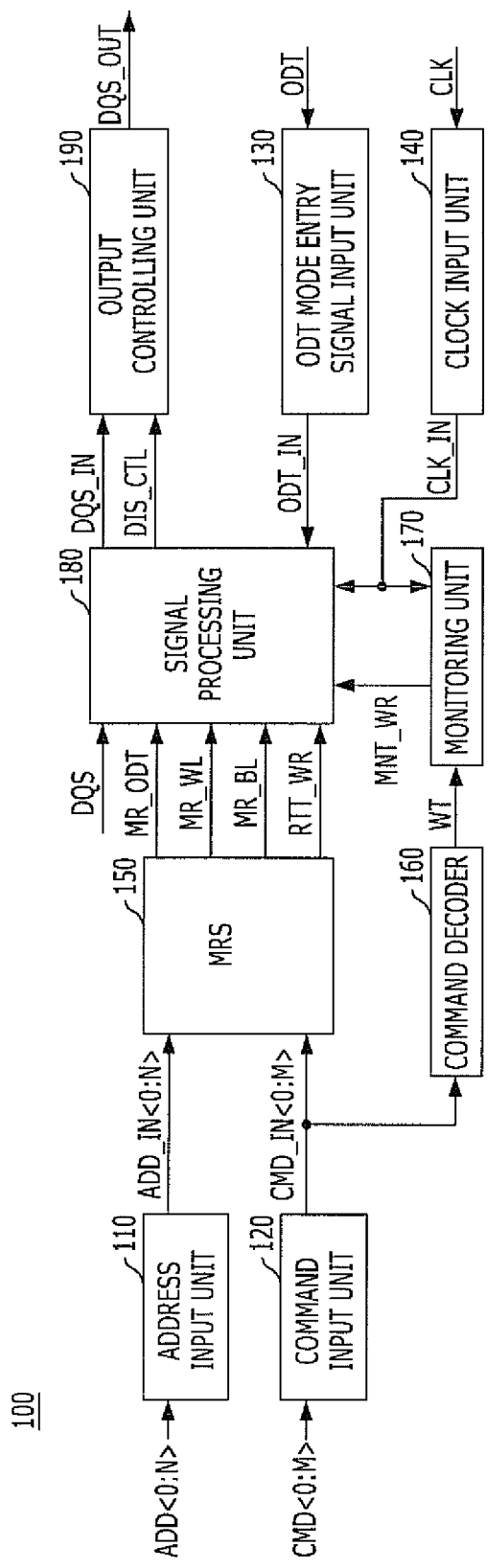
FIG. 1 is a block diagram of a semiconductor memory device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the following embodiment, a semiconductor memory device supporting a BL=4 mode and a BL=8 mode will be exemplarily described.

FIG. 1 is a block diagram of a semiconductor memory device in accordance with an embodiment of the present invention.

Referring to FIG. 1, the semiconductor memory device 100 includes an address input unit 110, a command input unit 120, an on die termination (ODT) mode entry signal input unit 130, a clock input unit 140, a mode register set (MRS) 150, a command decoder 160, a monitoring unit 170, a signal processing unit 180, and an output controlling unit 190.

The address input unit 110 generates a plurality of internal addresses ADD_IN<0:N> corresponding to a plurality of external addresses ADD<0:N>. The command input unit 120 generates a plurality of internal commands CMD_IN<0:M> corresponding to a plurality of external commands CMD<0:M>. The ODT mode entry signal input unit 130 generates an internal ODT mode entry signal ODT_IN corresponding to an external ODT mode entry signal ODT. The clock input unit 140 generates an internal clock CLK_IN corresponding to an external clock CLK.

The MRS 150 provides a dynamic ODT mode entry signal MR_ODT, write latency (WL) information MR_WL, burst length (BL) information, and termination resistance information RTT_WR in a dynamic ODT mode, in response to the plurality of internal addresses ADD_IN<0:N> and the plurality of internal commands CMD_IN<0:M>. The command decoder 160 generates write commands (WT) in response to the plurality of internal commands CMD_IN<0:M>. The monitoring unit 170 monitors an interval between the write commands WT in synchronization with the internal clock CLK_IN to output a monitoring signal MNT_WR. The signal processing unit 180 generates an internal data strobe signal DQS_IN and a filtering signal DIS_CTL in response to an external data strobe signal DQS, the internal ODT mode entry signal ODT_IN, the internal clock CLK_IN, the dynamic ODT mode entry signal MR_ODT, the write latency information MR_WL, the burst length information MR_BL, the termination resistance information RTT_WR in the dynamic ODT mode, and the monitoring signal MNT_WR.

For illustration purposes, the dynamic ODT mode refers to an operation in which if the write operation is started in such a state that the termination resistance corresponding to the ODT mode is set, the termination resistance is reset to a termination resistance corresponding to the write operation. The address input unit 110, the command input unit 120, the ODT mode entry signal input unit 130, and the clock input unit 140 serve to convert their input signals into CMOS-level output signals.

Figure 2:
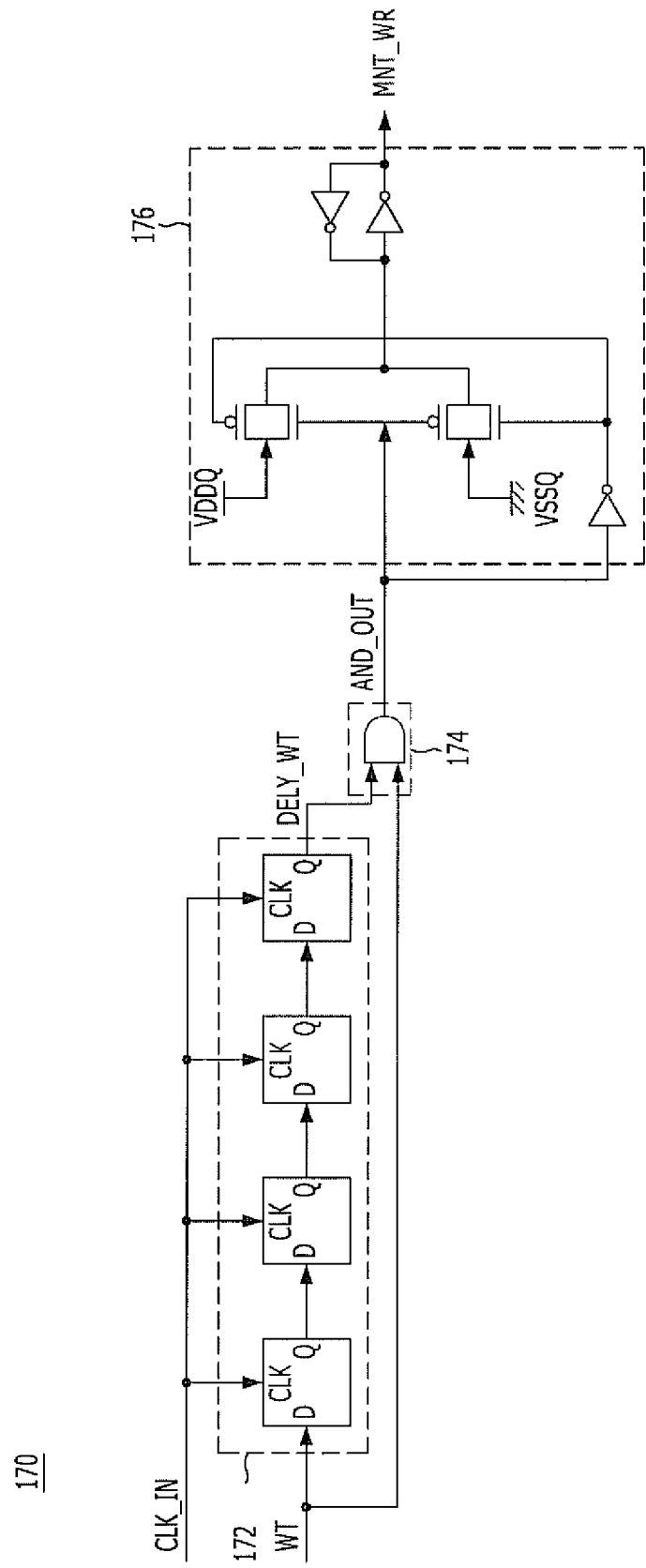
FIG. 2 is a configuration diagram of a monitoring unit illustrated in FIG. 1.

FIG. 2 is a configuration diagram of the monitoring unit 170 illustrated in FIG. 1.

Referring to FIG. 2, the monitoring unit 170 includes a delaying unit 172, an activation time point comparing unit 174, and a monitoring signal output unit 176.

The delaying unit 172 delays the write command WT by a set period in synchronization with the internal clock CLK_IN. The activation time point comparing unit 174 compares an activation time point of a delayed write command DELY_WT outputted from the delaying unit 172 with an activation time point of a next write command WT. The monitoring signal output unit 176 outputs the monitoring signal MNT_WR in response to an output signal AND_OUT of the activation time point comparing unit 174.

The delaying unit 172 includes a plurality of D flip-flops coupled in series. The delaying unit 172 delays the write command WT by the set period in synchronization with the internal clock CLK_IN. The set period refers to a minimum interval (tCCD) between column commands. For example, the minimum interval (tCCD) between the column commands corresponds to 4 clock cycles (4 tCK) in the BL=8 mode. Accordingly, the delaying unit 172 can be implemented with four D flip-flops.

The activation time point comparing unit 174 activates the output signal AND_OUT when the activation time point of the delayed write command DELY_WT is identical to the activation time point of the next write command WT, and deactivates the output signal AND_OUT when the activation time point of the delayed write command DELY_WT is different from the activation time point of the next write command WT. The activation time point comparing unit 174 may be implemented with an AND gate which performs an AND operation on the delayed write command DELY_WT and the next write command WT.

The monitoring signal output unit 176 includes a latch which latches the monitoring signal MNT_WR in response to the output signal AND_OUT of the activation time point comparing unit 174.

Figure 3:
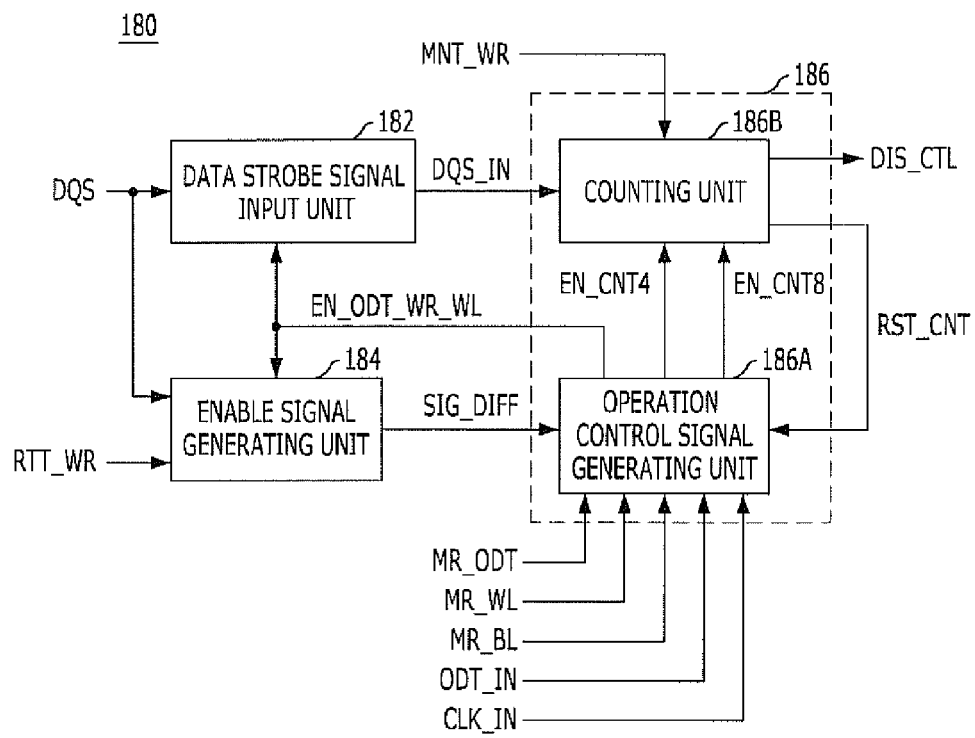
FIG. 3 is a configuration diagram of a signal processing unit illustrated in FIG. 1.
Figure 4:
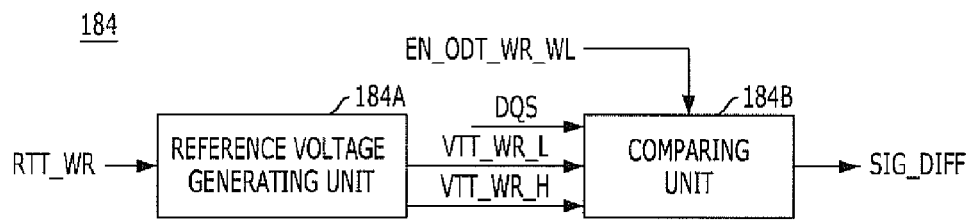
FIG. 4 is a configuration diagram of an enable signal generating unit illustrated in FIG. 3.
Figure 5A:
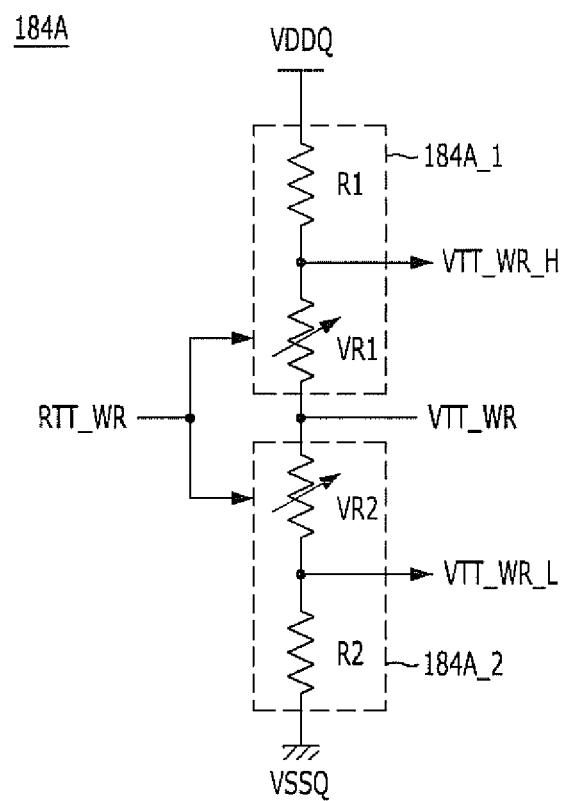
FIG. 5A is a configuration diagram of a reference voltage generating unit illustrated in FIG. 4.
Figure 5B:
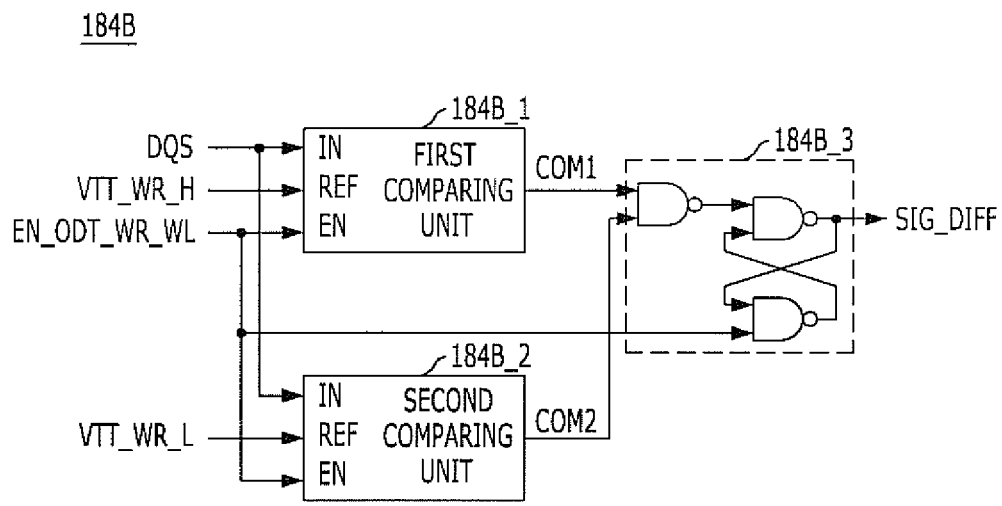
FIG. 5B is a configuration diagram of a comparison circuit illustrated in FIG. 4.
Figure 6:
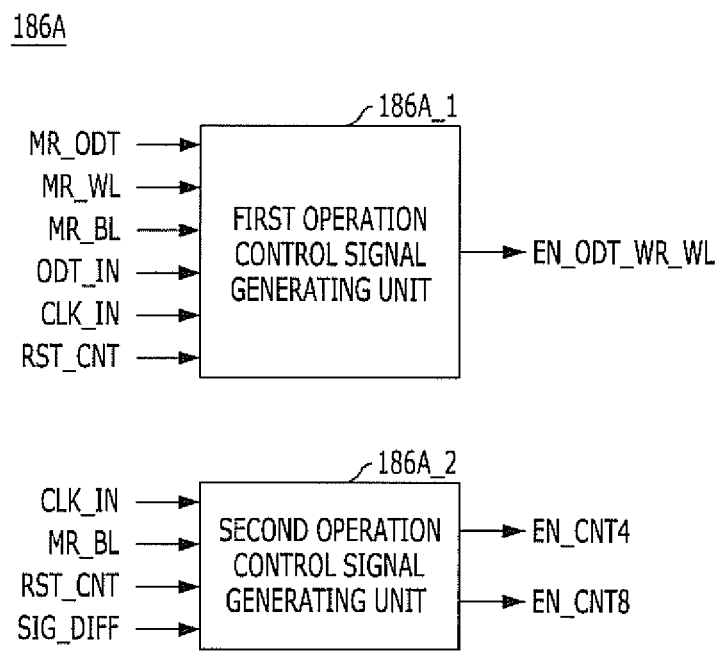
FIG. 6 is a configuration diagram of an operation control signal generating unit illustrated in FIG. 3.
Figure 7:
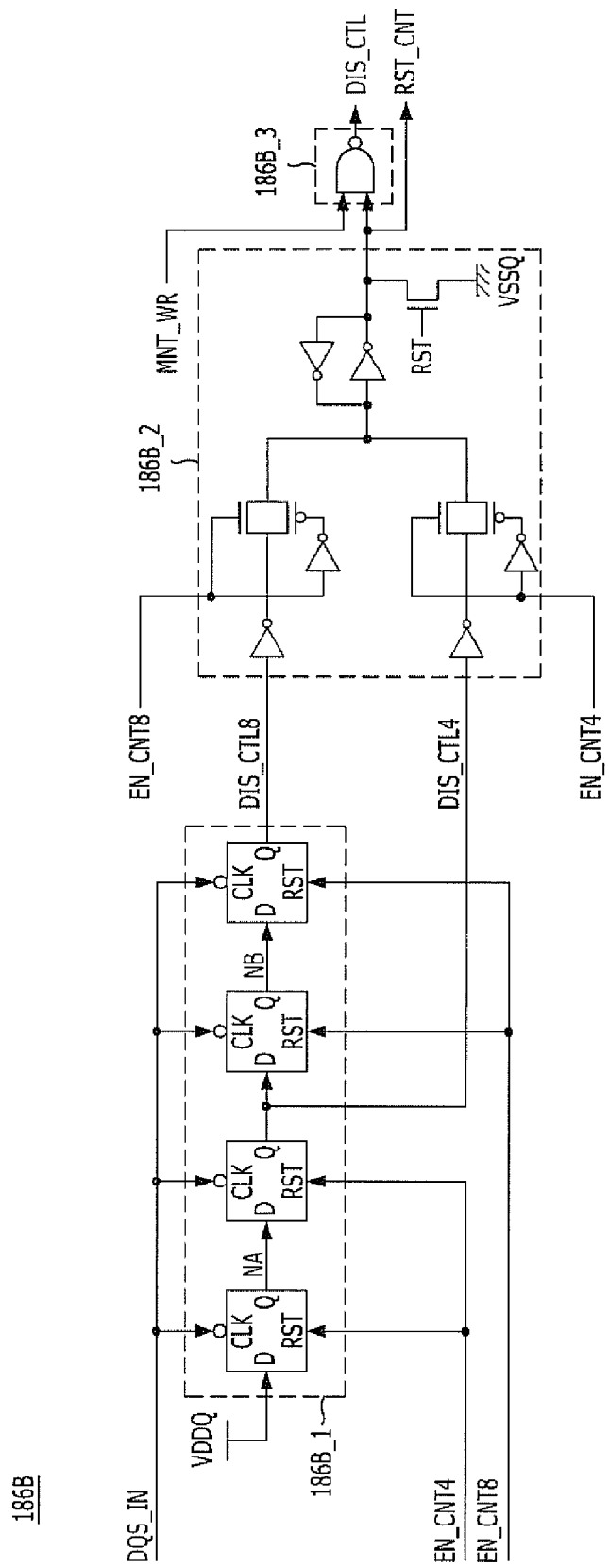
FIG. 7 is a configuration diagram of a counting unit illustrated in FIG. 3.

FIG. 3 is a configuration diagram of the signal processing unit 180 illustrated in FIG. 1, and FIG. 4 is a configuration diagram of an enable signal generating unit 184 illustrated in FIG. 3. FIG. 5A is a configuration diagram of a reference voltage generating unit 184A illustrated in FIG. 4, and FIG. 5B is a configuration diagram of a comparing unit 184B illustrated in FIG. 4. FIG. 6 is a configuration diagram of an operation control signal generating unit 186A illustrated in FIG. 3, and FIG. 7 is a configuration diagram of a counting unit 186B illustrated in FIG. 3.

Referring to FIG. 3, the signal processing unit 180 includes a data strobe signal input unit 182, an enable signal generating unit 184, and a filtering signal generating unit 186.

The data strobe signal input unit 182 is enabled in response to a first operation control signal EN_ODT_WR_WL and converts the external data strobe signal DQS into the CMOS-level internal data strobe signal DQS_IN. The enable signal generating unit 184 is enabled in response to the first operation control signal EN_ODT_WR_WL and generates an enable signal SIG_DIFF according to the external data strobe signal DQS and the termination resistance information RTT_WR in the dynamic ODT mode. The filtering signal generating unit 186 generates the first operation control signal EN_ODT_WR_WL and the filtering signal DIS_CTL in response to the monitoring signal MNT_WR, the internal data strobe signal DQS_IN, the enable signal SIG_DIFF, the internal ODT mode entry signal ODT_IN, the dynamic ODT mode entry signal MR_ODT, the write latency information WR_WL, the burst length information MR_BL, and the internal clock CLK_IN.

More specifically, the filtering signal generating unit 186 includes an operation control signal generating unit 186A and a counting unit 186B.

The operation control signal generating unit 186A generates the first operation control signal EN_ODT_WR_WL and a plurality of second operation control signals EN_CNT4 and EN_CNT8 in response to the enable signal SIG_DIFF, the internal ODT mode entry signal ODT_IN, the dynamic ODT mode entry signal MR_ODT, the write latency information WR_WL, the burst length information MR_BL, the internal clock CLK_IN, and a counting reset signal RST_CNT. The counting unit 186B counts the internal data strobe signal DQS_IN in response to the plurality of second operation control signals EN_CNT4 and EN_CNT8 and the monitoring signal MNT_WR, and generates the filtering signal DIS_CTL corresponding to the counting result.

As illustrated in FIG. 4, the enable signal generating unit 184 includes a reference voltage generating unit 184A and a comparing unit 184B. The reference voltage generating unit 184A generates a first reference voltage VTT_WR_H for determining a logic high state and a second reference voltage VTT_WR_L for determining a logic low state, according to the termination resistance information RTT_WR in the dynamic ODT mode. The comparing unit 184B compares the first and second reference voltages VTT_WR_H and VTT_WR_L with the voltage level of the external data strobe signal DQS and outputs the enable signal SIG_DIFF corresponding to the comparison result.

As illustrated in FIG. 5A, the reference voltage generating unit 184A includes a first reference voltage generating unit 184A_1 and a second reference voltage generating unit 184A_2. The first reference voltage generating unit 184A_1 is coupled between a high power supply voltage (VDDQ) terminal and an output (VTT_WR) terminal and generates the first reference voltage VTT_WR_H according to the termination resistance information RTT_WR in the dynamic ODT mode. A termination voltage VTT_WR according to the termination resistance information RTT_WR in the dynamic ODT mode is outputted through the output (VTT_WR) terminal. The second reference voltage generating unit 184A_2 is coupled between the output (VTT_WR) terminal and a low power supply voltage (VSSQ) terminal and generates the second reference voltage VTT_WR_L according to the termination resistance information RTT_WR in the dynamic ODT mode.

More specifically, the first reference voltage generating unit 184A_1 includes a first fixed resistor R1 and a first variable resistor VR1. The first fixed resistor R1 is coupled between the high power supply voltage (VDDQ) terminal and a first reference voltage (VTT_WR_H) output terminal and has a fixed/constant resistance. The first variable resistor VR1 is coupled between the first reference voltage (VTT_WR_H) output terminal and a termination voltage (VTT_WR) output terminal and has a variable resistance according to the termination resistance information RTT_WR in the dynamic ODT mode. The second reference voltage generating unit 184A_2 includes a second variable resistor VR2 and a second fixed resistor R2 (i.e., having constant resistance). The second variable resistor VR2 is coupled between the termination voltage (VTT_WR) output terminal and a second reference voltage (VTT_WR_L) output terminal and has a variable resistance according to the termination resistance information RTT_WR in the dynamic ODT mode. The second fixed resistor R2 is coupled between the second reference voltage (VTT_WR_L) output terminal and the low power supply voltage (VSSQ) terminal and has a fixed resistance.

Meanwhile, as illustrated in FIG. 5B, the comparing unit 184B includes a first comparing unit 184B_1, a second comparing unit 184B_2, and an enable signal output unit 184B_3. The first comparing unit 184B_1 compares the voltage level of the first reference voltage VTT_WR_H and the voltage level of the data strobe signal DQS. The second comparing unit 184B_2 compares the voltage level of the second reference voltage VTT_WR_L with the voltage level of the data strobe signal DQS. The enable signal output unit 184B_3 outputs the enable signal SIG_DIFF in response to the output signals of the first and second comparing units 184B_1 and 184B_2. The enable signal output unit 184B_3 includes a latch for latching the enable signal output unit 184C_3 in response to the first operation control signal EN_ODT_WR_WL. Although the embodiment including the first and second comparing units 184B_1 and 184B_2 has been exemplarily described, the present invention is not limited thereto. For example, only one of the first and second comparing units 184B_1 and 184B_2 may be provided and used in a different embodiment.

As illustrated in FIG. 6, the operation control signal generating unit 186A includes first operation control signal generating unit 186A_1 and a second operation control signal generating unit 186A_2. The first operation control signal generating unit 186A_1 generates the first operation control signal EN_ODT_WR_WL in response to the internal ODT mode entry signal ODT_IN, the dynamic ODT mode entry signal MR_ODT, the write latency information MR_WL, the burst length information MR_BL, the internal clock CLK_IN, and the counting reset signal RST_CNT. The second operation control signal generating unit 186A_2 generates the plurality of second operation control signals in response to the internal clock CLK_IN, the burst length information MR_BL, the counting reset signal RST_CNT, and the enable signal SIG_DIFF. The plurality of second operation control signals EN_CNT4 and EN_CNT8 have an activation period corresponding to the burst length, and two second operation control signals EN_CNT4 and EN_CNT8 are generated according to the BL=4 mode and the BL=8 mode.

As illustrated in FIG. 7, the counting unit 186B includes a counter 186B_1, a counting reset signal generating unit 186B_2, and a filtering signal output unit 186B_3. The counter 186B_1 performs a counting operation in response to the plurality of second operation control signals EN_CNT4 and EN_CNT8 and the internal data strobe signal DQS_IN, and generates first and second counting signals DIS_CTL4 and DIS_CTL8 corresponding to the burst length. The counting reset signal generating unit 186B_2 generates the counting reset signal RST_CNT in response to the plurality of second operation control signals EN_CNT4 and EN_CNT8 and the first and second counting signals DIS_CTL4 and DIS_CTL8. The filtering signal output unit 186B_3 outputs the counting reset signal RST_CNT as the filtering signal DIS_CTL in response to the monitoring signal MNT_WR.

More specifically, the counter 186B_1 includes a plurality of D flip-flops. The counting reset signal generating unit 186B_2 outputs the counting reset signal RST_CNT having a set voltage level according to a reset signal RST such as a power-up signal in an initial driving operation, and includes a latch which latches the counting reset signal RST_CNT. In addition, the filtering signal output unit 186B_3 may include a NAND gate which performs a NAND operation on the counting reset signal RST_CNT and the monitoring signal MNT_WR and outputs the filtering signal DIS_CTL.

Figure 8:
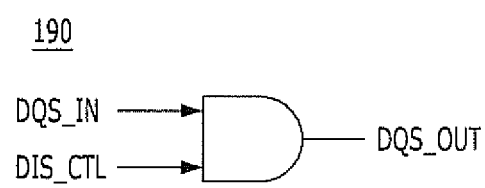
FIG. 8 is a configuration diagram of an output controlling unit illustrated in FIG. 1.

Meanwhile, as illustrated in FIG. 8, the output controlling unit 190 may include an AND gate which performs an AND operation on the filtering signal DIS_CTL and the internal data strobe signal DQS_IN and outputs the filtered data strobe signal DQS_OUT.

Hereinafter, a method for operating a semiconductor memory device in accordance with an embodiment of the present invention will be described with reference to FIGS. 9 to 12. For reference, signals NA and NB shown in FIGS. 9, 10 and 12 denote signals at nodes NA and NB of FIG. 7, respectively.

Figure 9:
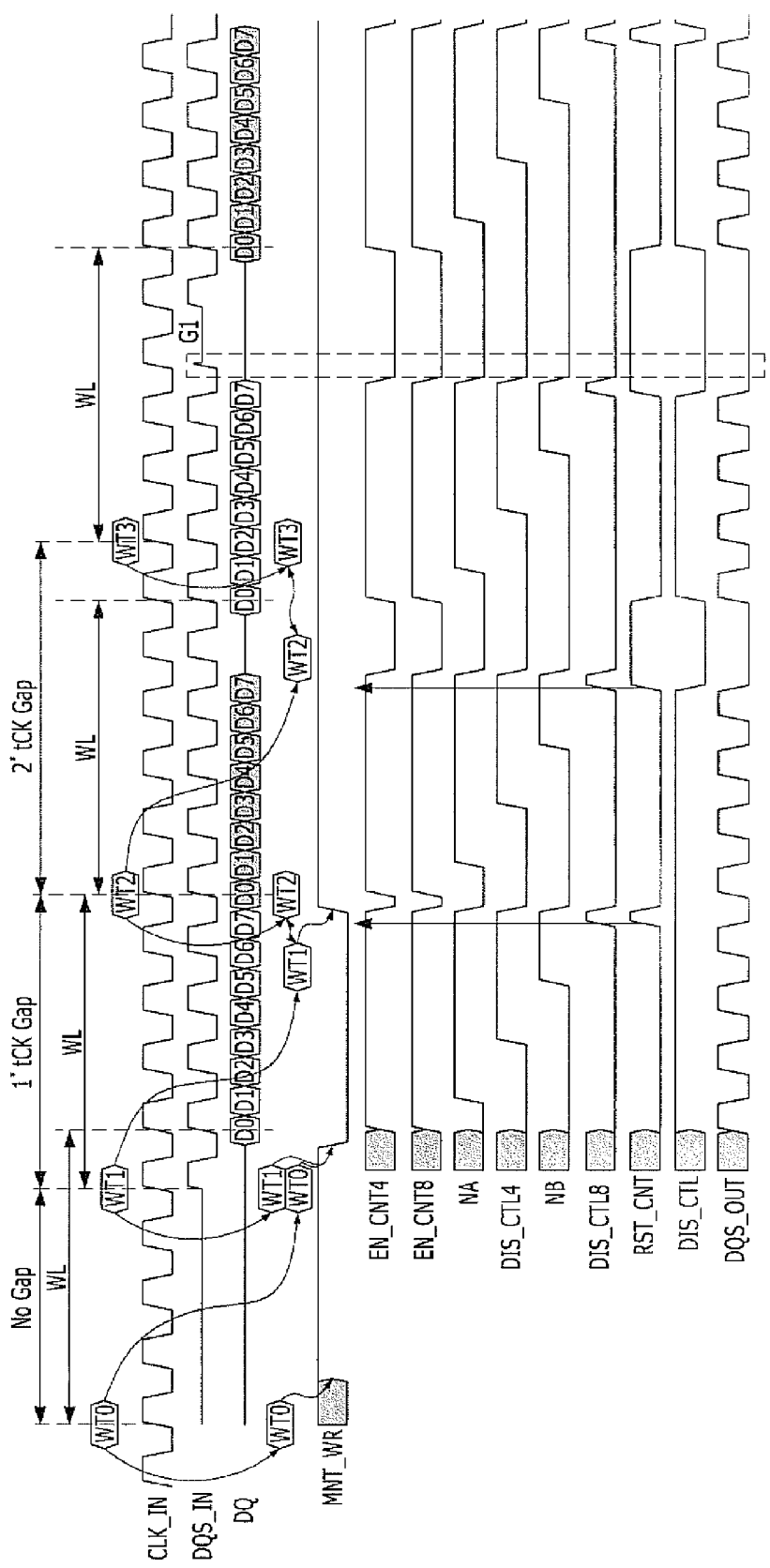
FIGS. 9 to 12 are timing diagrams illustrating a method for operating a semiconductor memory device in accordance with an embodiment of the present invention.

FIG. 9 is a timing diagram illustrating a method for operating a semiconductor memory device according to an interval (that is, time interval) between write commands.

In this embodiment, the BL=8 mode will be exemplarily described.

Referring to FIG. 9, the monitoring unit 170 monitors the interval between the write commands WT outputted from the command decoder 160 and generates the monitoring signal MNT_WR corresponding to the monitoring result. At this time, the monitoring unit 170 deactivates the monitoring signal MNT_WR when the interval between the adjacent write commands WT is the minimum interval (tCCD) between the column commands and activates the monitoring signal MNT_WR when the interval between the adjacent write commands WT is greater than the minimum interval (tCCD) between the column commands. For example, the minimum interval (tCCD) between the column commands may be 4 clock cycles (4 tCK) in the BL=8 mode. Here, the interval between the first write command WT0 and the second write command WT1 may be the minimum interval (tCCD) between the column commands, that is, four clock cycles (4 tCK). In this case, the monitoring signal MNT_WR is deactivated to a logic low level. On the other hand, according to another example, the interval between the second write command WT1 and the third write command WT2 and the interval between the third write command WT2 and the fourth write command WT3 may be more than five clock cycles (5 tCK). In this case, the monitoring signal MNT_WR is activated to a logic high level.

Here, when the monitoring signal MNT_WR is deactivated, the signal processing unit 180 outputs the filtering signal DIS_CTL to have a logic high level. Accordingly, the output controlling unit 190 continuously outputs the internal data strobe signal DQS_IN without filtering. Since the interval between the write commands WT has the minimum interval (tCCD), the internal data strobe signal DQS_IN also continuously toggles without gap. Thus, the internal data strobe signal DQS_IN is to be filtered in a period in which no write postamble ringing occurs.

On the other hand, when the monitoring signal MNT_WR is activated, the signal processing unit 180 outputs the filtering signal DIS_CTL corresponding to the burst length. Accordingly, the output controlling unit 190 filters the internal data strobe signal DQS_IN in response to the activation period of the filtering signal DIS_CTL and outputs the filtered data strobe signal DQS_OUT. This is because as the interval between the write commands WT becomes greater than the minimum interval (tCCD), a gap is formed in the internal data strobe signal DQS_IN. The portion where the gap is formed is the postamble period in which the toggling internal data strobe signal DQS_IN returns to the high impedance (Hi-Z) state. In order to prevent the write postamble ringing G1 occurring in the postamble period, the internal data strobe signal DQS_IN is to be filtered.

The case in which the monitoring signal MNT_WR is activated is described as follows in more detail with reference to FIGS. 10 to 12.

Figure 10:
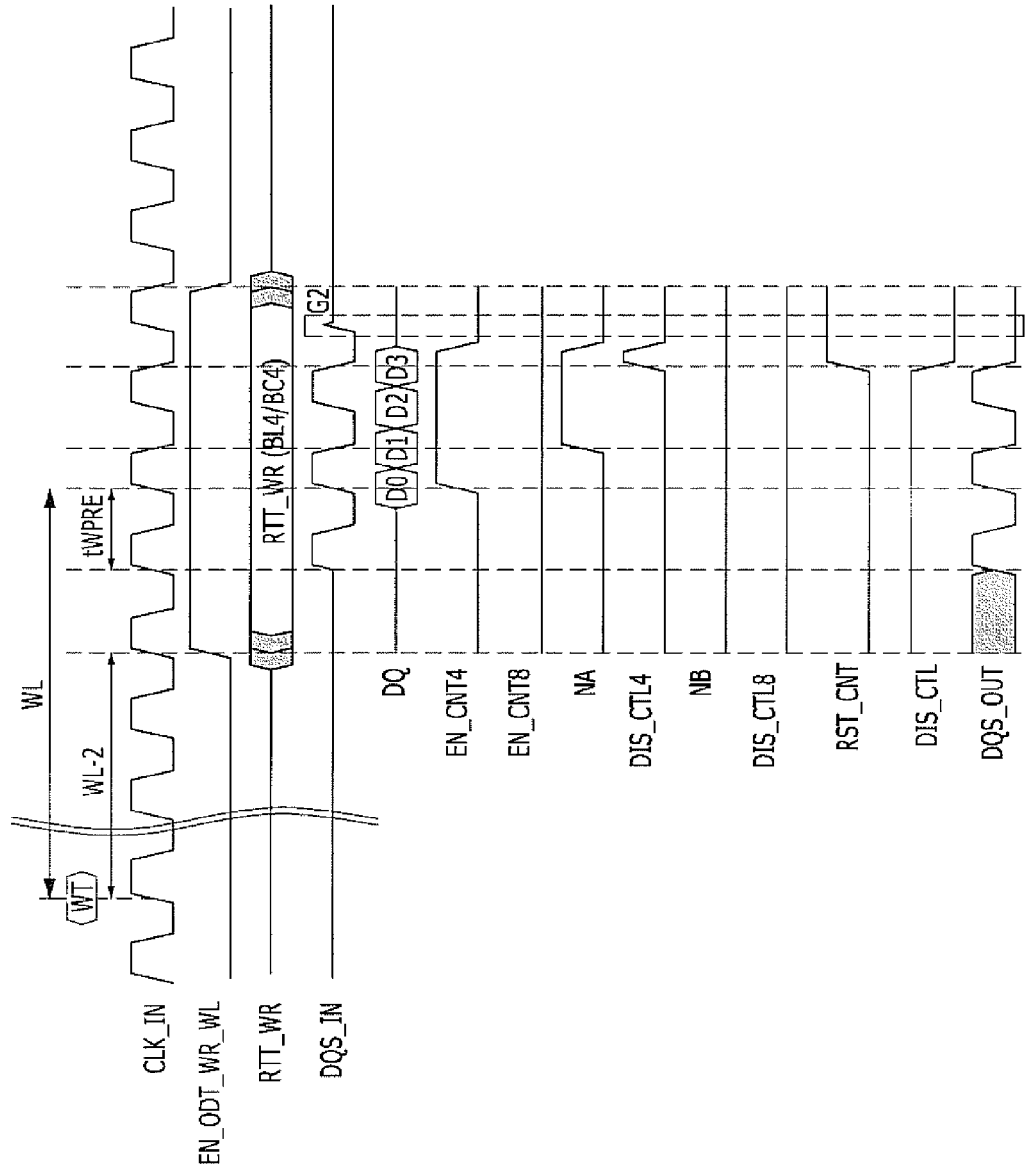
Figure 11:
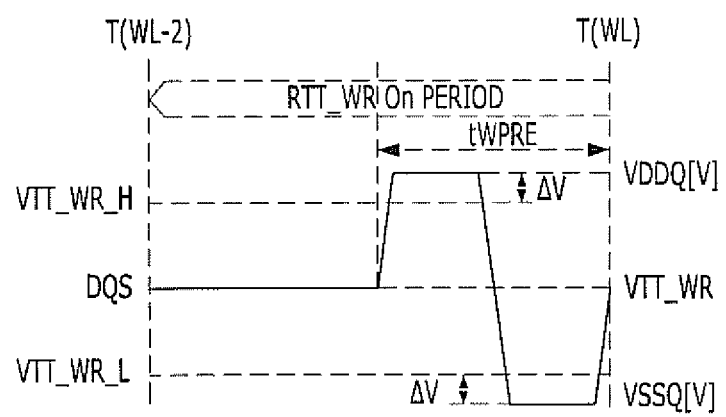

FIG. 10 is a timing diagram illustrating the method for operating the semiconductor memory device 100 in the BL=4 mode, and FIG. 11 is a timing diagram illustrating the operation of generating the enable signal SIG_DIFF. FIG. 12 is a timing diagram illustrating the method for operating the semiconductor memory device 100 in the BL=8 mode.

Referring to FIG. 10, after the write command WT is inputted, the dynamic ODT mode entry is performed before the data strobe signal DQS toggles. Here, the semiconductor memory device 100 enters the dynamic ODT mode after 'the write latency (WL)—2 clock cycles (2 tCK)' elapses from the input of the write command WT. At this time, the termination resistance information RTT_WR in the dynamic ODT mode is provided together.

Meanwhile, the first operation control signal generating unit 186A_1 activates the first operation control signal EN_ODT_WR_WL as the semiconductor memory device 100 enters the dynamic ODT mode. Thus, the data strobe signal input unit 182 and the enable signal generating unit 184 perform their set operations. That is, the data strobe signal input unit 182 converts the external data strobe signal DQS into the CMOS-level internal data strobe signal DQS_IN. The enable signal generating unit 184 detects the toggling start time point of the data strobe signal DQS and generates the enable signal SIG_DIFF. More specifically, referring to FIG. 11, the reference voltage generating unit 184A generates the first reference voltage VTT_WR_H for determining the logic high state and the second reference voltage VTT_WR_L for determining the logic low state, according to the termination resistance information RTT_WR in the dynamic ODT mode. The comparing unit 184B determines the logic state of the external data strobe signal DQS, based on the first and second reference voltages VTT_WR_H and VTT_WR_L, and activates the enable signal SIG_DIFF according to the determination result. In general, since the data strobe signal DQS maintains the high impedance (Hi-Z) state and then toggles in the preamble period (tWPRE), the enable signal SIG_DIFF is activated in the preamble period (tWPRE).

Referring again to FIG. 10, the second operation control signal generating unit 186A_2 generates the plurality of second operation control signals EN_CNT4 and EN_CNT8 in response to the enable signal SIG_DIFF. At this time, according to an example, only the second operation control signal EN_CNT4 corresponding to the BL=4 mode is activated according to the burst length information MR_BL.

The counting unit 186B generates the filtering signal DIS_CTL in response to the plurality of second operation control signals EN_CNT4 and EN_CNT8, the internal data strobe signal DQS_IN, and the monitoring signal MNT_WR. More specifically, the counter 186B_1 performs the counting operation in synchronization with the falling edge of the internal data strobe signal DQS_IN during the activation period of the second operation control signal EN_CNT4 and outputs the first and second counting signals DIS_CTL4 and DIS_CTL8. The counting reset signal generating unit 186B_2 selects the first counting signal DIS_CTL4 from the first and second counting signals DIS_CTL4 and DIS_CTL8 in response to the plurality of second operation control signals EN_CNT4 and EN_CNT8, latches and outputs the selected first counting signal DIS_CTL4 as the counting reset signal RST_CNT. In addition, the filtering signal output unit 186B_3 outputs the counting reset signal RSTCNT as the filtering signal DIS_CTL in response to the monitoring signal MNT_WR.

Since the output controlling unit 190 outputs the filtered data strobe signal DQS_OUT by outputting the internal data strobe signal DQS_IN during, for example, only the activation period of the filtering signal DIS_CTL. At this time, even though the write postamble ringing G2 occurs in the internal data strobe signal DQS_IN, the write postamble ringing G2 is prevented by the filtering signal DIS_CTL when the filtered data strobe signal DQS_OUT is outputted.

Although the filtering signal DIS_CTL illustrated in FIG. 9 is to be activated during the set period corresponding to the BL=4 mode, it is illustrated in FIG. 9 as shown because the initial driving (or resetting) operation of the semiconductor memory device 100 is also illustrated as an example. Thus, in the initial driving (or resetting) operation, the filtered data strobe signal DQS_OUT includes the preamble period (tWPRE).

Figure 12:
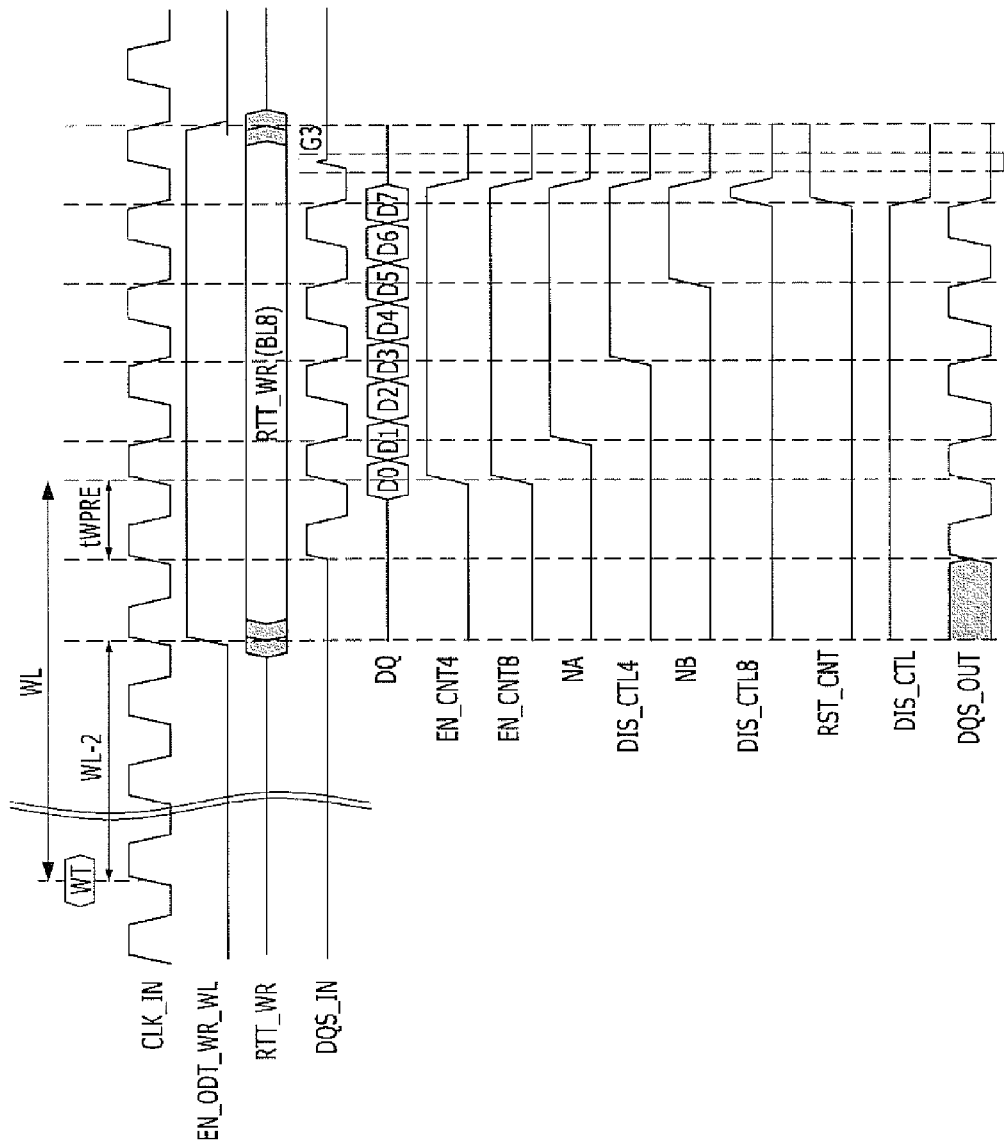

Referring to FIG. 12, the semiconductor memory device 100 enters the dynamic ODT mode after 'the write latency (WL)—2 clock cycles (2 tCK)' elapses from the input of the write command WT. At this time, the termination resistance information RTT_WR in the dynamic ODT mode is provided.

When the semiconductor memory device 100 enters the dynamic ODT mode, the first operation control signal generating unit 186A_1 activates the first operation control signal EN_ODT_WR_WL. Then, data strobe signal input unit 182 converts the external data strobe signal DQS into the CMOS-level internal data strobe signal DQS_IN, and the enable signal generating unit 184 detects the toggling start time point of the data strobe signal DQS and generates the enable signal SIG_DIFF (see FIG. 11). At this time, the enable signal SIG_DIFF starts to be activated in the preamble period (tWPRE) of the internal data strobe signal DQS_IN.

The second operation control signal generating unit 186_2 generates the plurality of second operation control signals EN_CNT4 and EN_CNT8 in response to the enable signal SIG_DIFF. At this time, the plurality of second operation control signals EN_CNT4 and EN_CNT8 are all activated corresponding to the BL=8 mode in response to the burst length information MR_BL.

The counter 186B_1 performs the counting operation in synchronization with the falling edge of the internal data strobe signal DQS_IN during the activation period of the plurality of second operation control signals EN_CNT4 and EN_CNT8, and outputs the first ands second counting signals DIS_CTL4 and DIS_CTL8. The counting reset signal generating unit 186B_2 selects the second counting signal DIS_CTL8 from the first and second counting signals DiS_CTL4 and DIS_CTL8 in response to the plurality of second operation control signals EN_CNT4 and EN_CNT8, and latches and outputs the selected counting signal DIS_CTL8 as the counting reset signal RST_CNT. In addition, the filtering signal output unit 186B_3 outputs the counting reset signal RST_CNT as the filtering signal DIS_CTL in response to the monitoring signal MNT_WR.

Accordingly, the output controlling unit 190 outputs the filtered data strobe signal DQS_OUT by outputting the internal data strobe signal DQS_IN during, for example, only the activation period of the internal data strobe signal DQS_IN. At this time, even if the write postamble ringing G3 occurs in the internal data strobe signal DQS_IN, the write postamble ringing G3 is prevented by the filtering signal DIS_CTL when the filtered data strobe signal DQS_OUT is outputted.

For illustration purposes, although the filtering signal DIS_CTL illustrated in FIG. 12 is to be activated during the set period corresponding to the BL=8 mode, it is illustrated in FIG. 12 as shown because the initial driving (or resetting) operation of the semiconductor memory device 100 is taken as an example. Thus, in the initial driving (or resetting) operation, the filtered data strobe signal DQS_OUT includes the preamble period (tWPRE).

In accordance with the exemplary embodiments of the present invention, the write postamble ringing of the data strobe signal may be adequately prevented by applying the method of counting the data strobe signal upon the entry into the dynamic ODT mode.

In addition, since the operation of synchronizing domains of different signals is not separately performed, the signal delay and malfunction may be prevented. Thus, the write postamble ringing of the data strobe signal may be prevented, the high speed operation may be achieved, and the current consumption may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a signal processing unit configured to receive a data strobe signal and generate a control signal corresponding to burst length information in an on-die-termination (ODT) mode;
    an output controlling unit configured to control an output timing of the data strobe signal in response to the control signal; and
    a monitoring unit configured to monitor a time interval between column commands to output a monitoring signal;
    wherein the signal processing unit deactivates the control signal in response to the monitoring signal when the time interval between the column commands is determined to equal a first time interval.

2. The semiconductor memory device of claim 1, wherein the column commands comprise a write command.

3. The semiconductor memory device of claim 1, wherein the signal processing unit and the monitoring unit are configured to be synchronized with a same clock.

4. The semiconductor memory device of claim 1, wherein the signal processing unit is configured to count the data strobe signal in correspondence to the burst length information and generate the control signal corresponding to a result of the count.

5. A semiconductor memory device comprising:
    a first input unit configured to output an internal data strobe signal in response to an external data strobe signal;
    an enable signal generating unit configured to generate an enable signal according to the external data strobe signal and termination resistance information;
    a filtering signal generating unit configured to generate a filtering signal in response to the internal data strobe signal, the enable signal, an internal on-die-termination (ODT) mode entry signal, an ODT mode related signal comprising burst length information, and an internal clock; and an output controlling unit configured to receive the internal data strobe signal and stop an output period of the internal data strobe signal in response to the filtering signal.

6. The semiconductor memory device of claim 5, further comprising a monitoring unit configured to monitor a time interval between write commands to output a monitoring signal, wherein the filtering signal generating unit is configured to activate the filtering signal in response to the monitoring signal.

7. The semiconductor memory device of claim 6, wherein the ODT related signal comprises an ODT mode entry signal, write latency information, and the burst length information.

8. The semiconductor memory device of claim 7, wherein the filtering signal generating unit comprises:

an operation control signal generating unit configured to generate a first operation control signal for controlling the first input unit and the enable signal generating unit and a plurality of second operation control signals in response to the enable signal, the internal ODT mode entry signal, the ODT mode related signal, the internal clock, a counting reset signal; and a counting unit configured to count the internal data strobe signal in response to the plurality of second operation control signals and the monitoring signal and generate the filtering signal corresponding to the counting result.

9. The semiconductor memory device of claim 8, wherein the operation control signal generating unit comprises:

a first operation control signal generating unit configured to generate the first operation control signal in response to the internal ODT mode entry signal, the ODT mode related signal, the internal clock, and the counting reset signal; and a second operation control signal generating unit configured to generate the plurality of second operation control signals in response to the enable signal, the burst length information, the internal clock, and the counting reset signal.

10. The semiconductor memory device of claim 8, wherein the counting unit comprises:

a counter configured to perform a counting operation in response to the plurality of second operation control signals and the internal data strobe signal and generate a plurality of counting signals;

a counting reset signal generating unit configured to generate the counting reset signal in response to the plurality of second operation control signals and the plurality of counting signals; and a filtering signal output unit configured to output the counting reset signal as the filtering signal in response to the monitoring signal.

11. The semiconductor memory device of claim 10, wherein the counter comprises a plurality of D flip-flops.

12. The semiconductor memory device of claim 10, wherein the counting reset signal generating unit is configured to select one of the plurality of counting signals in response to the plurality of second operation control signals, and latch and output the selected counting signal as the counting reset signal.

13. The semiconductor memory device of claim 12, wherein the counting reset signal is set to an initial level in an initial driving operation.

14. The semiconductor memory device of claim 6, wherein the monitoring unit comprises:

a delay unit configured to delay the write command by a set interval;

an activation time point comparing unit configured to compare an activation time point of the delayed write command outputted from the delay unit with an activation time point of a write command occurring subsequently to the first write command; and a monitoring signal output unit configured to output the monitoring signal in response to an output signal of the activation time point comparing unit.

15. The semiconductor memory device of claim 14, wherein the monitoring signal output unit comprises a latching unit configured to latch the monitoring signal.

16. The semiconductor memory device of claim 5, wherein the enable signal generating unit comprises:

a reference voltage generating unit configured to generate a reference voltage according to termination resistance information in the ODT mode; and a comparison circuit configured to compare a voltage level of the reference voltage with a voltage level of the data strobe signal and output the enable signal in response to a result of the comparison.

17. The semiconductor memory device of claim 5, wherein the enable signal generating unit comprises:

a reference voltage generating unit configured to generate a first reference voltage for determining a logic high state and a second reference voltage for determining a logic low state, according to termination resistance information in the ODT mode; and a comparison circuit configured to compare voltage levels of the first and second reference voltages with a voltage level of the data strobe signal and output the enable signal corresponding to a result of the comparison in the comparison circuit.

18. The semiconductor memory device of claim 17, wherein the reference voltage generating unit comprises:

a first reference voltage generating unit coupled between a high power supply voltage terminal and a termination voltage output terminal and configured to generate the first reference voltage according to the termination resistance information in the ODT mode; and a second reference voltage generating unit coupled between the termination voltage output terminal and a low power supply voltage terminal and configured to generate the second reference voltage according to the termination resistance information in the ODT mode.

19. The semiconductor memory device of claim 18, wherein the first reference voltage generating unit comprises:

a first constant resistor coupled between the high power supply voltage terminal and a first reference voltage output terminal and having a constant resistance; and a first variable resistor coupled between the first reference voltage output terminal and the termination voltage output terminal and having a variable resistance which varies according to the termination resistance information.

20. The semiconductor memory device of claim 19, wherein the second reference voltage generating unit comprises:

a second variable resistor coupled between the termination voltage output terminal and a second reference voltage output terminal and having a variable resistance which varies according to the termination resistance information; and a second constant resistor coupled between the second reference voltage output terminal and the low power supply voltage terminal and having a constant resistance.

21. The semiconductor memory device of claim 17, wherein the comparison circuit comprises:
   a first comparing unit configured to compare a voltage level of the first reference voltage with a voltage level of the data strobe signal;
   a second comparing unit configured to compare a voltage level of the second reference voltage with a voltage level of the data strobe signal; and
   an enable signal output unit configured to output the enable signal in response to output signals of the first and second comparing units.

22. The semiconductor memory device of claim 21, wherein the enable signal output unit comprises a latch.

23. The semiconductor memory device of claim 5, wherein the semiconductor memory device further comprises:
   a second input unit configured to generate the internal ODT mode entry signal corresponding to an external ODT mode entry signal; and
   a third input unit configured to generate the internal clock corresponding to an external clock.

24. The semiconductor memory device of claim 6, further comprising a mode register set (MRS) configured to generate the termination resistance information in the ODT mode and the ODT mode signal in response to a plurality of internal addresses and a plurality of internal commands.

25. The semiconductor memory device of claim 24, wherein the semiconductor memory device further comprises:
   a fourth input unit configured to generate the plurality of internal addresses corresponding to a plurality of external addresses; and
   a fifth input unit configured to generate the plurality of internal commands corresponding to a plurality of external commands.

26. The semiconductor memory device of claim 25, further comprising a command decoder configured to generate the write command in response to the plurality of internal commands.

* * * * *